(12) United States Patent
Suwa et al.

(10) Patent No.: US 11,538,929 B2
(45) Date of Patent: Dec. 27, 2022

(54) SEMICONDUCTOR DEVICE AND METHOD FOR CONTROLLING SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Shibuya Tokyo (JP); Yoko Iwakaji, Meguro Tokyo (JP); Hiroko Itokazu, Kawasaki Kanagawa (JP); Takako Motai, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/170,468

(22) Filed: Feb. 8, 2021

(65) Prior Publication Data
US 2022/0093776 A1   Mar. 24, 2022

(30) Foreign Application Priority Data
Sep. 18, 2020 (JP) .............................. JP2020-157529

(51) Int. Cl.
*H01L 29/739* (2006.01)
*H03K 17/60* (2006.01)
(Continued)

(52) U.S. Cl.
CPC ...... *H01L 29/7397* (2013.01); *H01L 29/1033* (2013.01); *H01L 29/42336* (2013.01); *H01L 29/7393* (2013.01); *H03K 17/60* (2013.01)

(58) Field of Classification Search
CPC ............ H01L 29/7397; H01L 29/1033; H01L 29/42336; H01L 29/7393; H01L 29/1095;
(Continued)

(56) References Cited

U.S. PATENT DOCUMENTS

| 5,245,202 A | 9/1993 | Yasukazu |
| 2016/0111529 A1* | 4/2016 | Hirabayashi ........ H01L 29/7397 257/139 |

(Continued)

FOREIGN PATENT DOCUMENTS

| JP | H01181571 A | 7/1989 |
| JP | H05235363 A | 9/1993 |

(Continued)

*Primary Examiner* — Wasiul Haider
(74) *Attorney, Agent, or Firm* — Kim & Stewart LLP

(57) ABSTRACT

A semiconductor device includes first and third semiconductor layers of a first conductivity type, and second, fourth and fifth semiconductor layers of a second conductivity type. The first semiconductor layer is provided on the fifth semiconductor layer. The second semiconductor layer is provided on the first semiconductor layer. The third and fourth semiconductor layers are arranged along the second semiconductor layer. In a plane parallel to an upper surface of the second semiconductor layer, the fourth semiconductor layer has a surface area greater than a surface area of the third semiconductor layer. The device further includes first to third electrodes, and first control electrode. The first to third electrodes are electrically connected to the third to fifth semiconductor layers, respectively. The first control electrode is provided in a first trench extending into the first semiconductor layer from an upper surface of the third semiconductor layer.

10 Claims, 6 Drawing Sheets

(51) Int. Cl.
*H01L 29/10* (2006.01)
*H01L 29/423* (2006.01)

(58) Field of Classification Search
CPC .............. H01L 29/407; H01L 29/0696; H01L 29/66325; H03K 17/60
See application file for complete search history.

(56) References Cited

U.S. PATENT DOCUMENTS

2019/0386122 A1     12/2019  Umemoto et al.
2020/0365582 A1*    11/2020  Yoshida ................ H01L 29/063

FOREIGN PATENT DOCUMENTS

| JP | 2003023157 | A | * | 1/2003 |
| JP | 2003023157 | A |   | 1/2003 |
| JP | 2003318409 | A |   | 11/2003 |
| JP | 2019195007 | A |   | 11/2019 |
| JP | 2019220501 | A |   | 12/2019 |

* cited by examiner

SEMICONDUCTOR DEVICE AND METHOD FOR CONTROLLING SAME

CROSS-REFERENCE TO RELATED APPLICATIONS

This application is based upon and claims the benefit of priority from Japanese Patent Application No. 2020-157529, filed on Sep. 18, 2020; the entire contents of which are incorporated herein by reference.

FIELD

Embodiments relate to a semiconductor device and a method for controlling the same.

BACKGROUND

A semiconductor device is included in a power converter such as an inverter or the like. It is desirable for such a device to increase breakdown immunity for a short-circuit current or the like.

DETAILED DESCRIPTION

Figure 1:
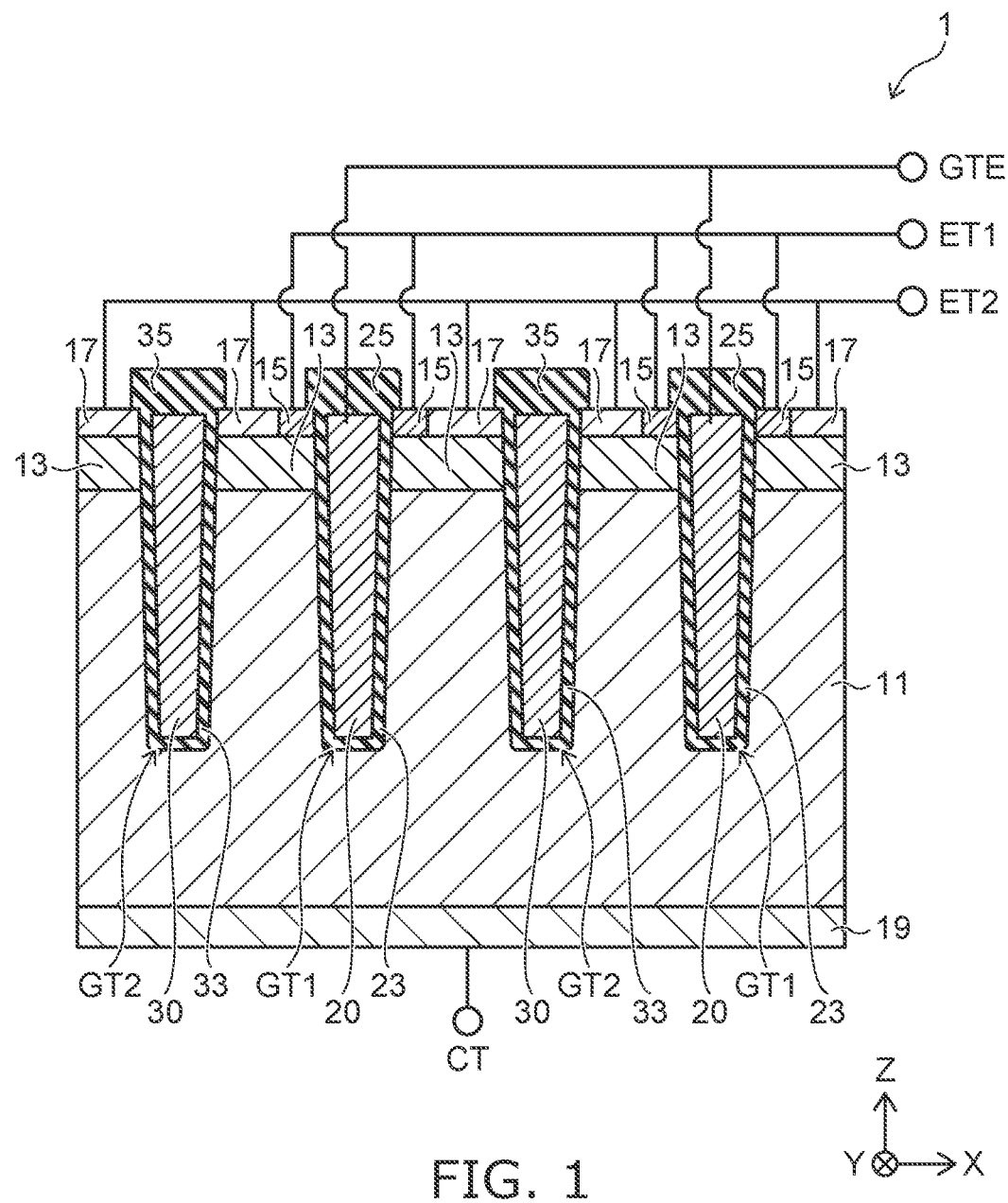
FIG. 1 is a schematic cross-sectional view showing a semiconductor device according to an embodiment.
Figure 2A:
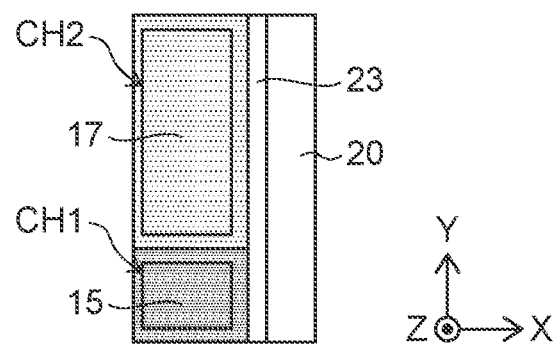
FIGS. 2A to 2D are schematic plan views showing the semiconductor device according to the embodiment.
Figure 2B:
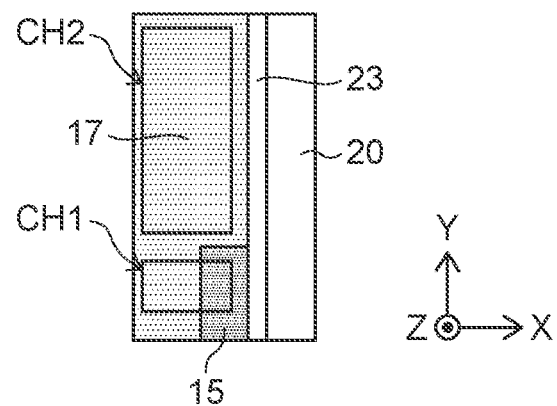
Figure 2C:
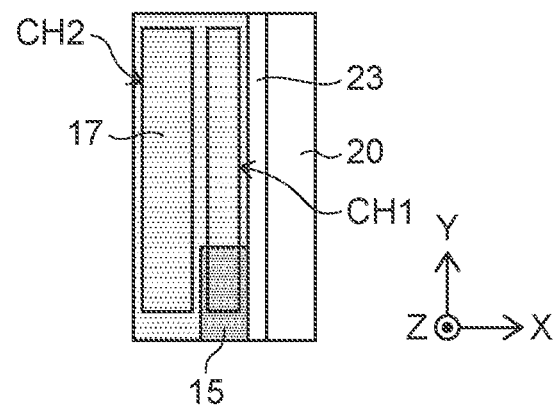
Figure 2D:
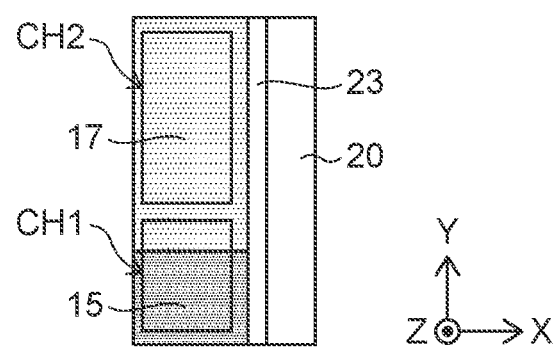

According to one embodiment, a semiconductor device includes first and third semiconductor layers of a first conductivity type and second, fourth and fifth semiconductor layers of a second conductivity type. The second semiconductor layer is provided on the first semiconductor layer. The third semiconductor layer is provided selectively on the second semiconductor layer. The fourth semiconductor layer is provided selectively on the second semiconductor layer. The third and fourth semiconductor layers are arranged along the second semiconductor layer and have first and second surface areas respectively in a plane parallel to an upper surface of the second semiconductor layer. The second surface area of the fourth semiconductor layer is greater than the first surface area of the third semiconductor layer. The first semiconductor layer is provided between the second semiconductor layer and the fifth semiconductor layer. The device further includes first to third electrode, first and second control electrodes and a control terminal. The first electrode is electrically connected to the third semiconductor layer. The second electrode is electrically connected to the fourth semiconductor layer. The third electrode is electrically connected to the fifth semiconductor layer. The first control electrode is provided in a first trench extending into the first semiconductor layer from an upper surface of the third semiconductor layer. The first control electrode is electrically insulated from the first, second, and third semiconductor layers by a first insulating film. The second semiconductor layer faces the first control electrode via the first insulating film. The third semiconductor layer contacts the first insulating film. The control terminal is electrically connected to the first control electrode.

According to another embodiment, a method for controlling the semiconductor device sets a potential connected to the fourth semiconductor layer via the second electrode to be less than a potential connected to the third semiconductor layer via the first electrode.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, an IGBT (Insulated Gate Bipolar Transistor).

As shown in FIG. 1, the semiconductor device 1 includes a first semiconductor layer 11 of a first conductivity type, a second semiconductor layer 13 of a second conductivity type, a third semiconductor layer 15 of the first conductivity type, a fourth semiconductor layer 17 of the second conductivity type, a fifth semiconductor layer 19 of the second conductivity type, a first control electrode 20, and a second control electrode 30. In the description hereinbelow, the first conductivity type is an n-type, and the second conductivity type is a p-type.

The first to fifth semiconductor layers are, for example, silicon. The first semiconductor layer 11 is, for example, an n-type base layer. The second semiconductor layer 13 is, for example, a p-type base layer. The second semiconductor layer 13 is provided on the first semiconductor layer 11.

The third semiconductor layer 15 is, for example, an n-type emitter layer. The third semiconductor layer 15 is provided selectively on the second semiconductor layer 13. The third semiconductor layer 15 includes, for example, a first-conductivity-type impurity with a higher concentration than a concentration of the first-conductivity-type impurity in the first semiconductor layer 11.

The fourth semiconductor layer 17 is, for example, a p-type emitter layer. The fourth semiconductor layer 17 is provided selectively on the second semiconductor layer 13. The fourth semiconductor layer 17 includes, for example, a second-conductivity-type impurity with a higher concentration than a concentration of the second-conductivity-type impurity in the second semiconductor layer 13. The third semiconductor layer 15 and the fourth semiconductor layer 17 are arranged along the second semiconductor layer 13.

The fifth semiconductor layer 19 is, for example, a p-type collector layer. The first semiconductor layer 11 is provided between the second semiconductor layer 13 and the fifth semiconductor layer 19.

The first control electrode 20 is, for example, a gate electrode. The first control electrode 20 is, for example, conductive polysilicon and is provided in a trench GT1. For example, the trench GT1 extends in the Z-direction and has a depth from the upper surface of the third semiconductor layer 15 into the first semiconductor layer 11. For example, the trench GT1 also extends in the Y-direction. The first control electrode 20 extends, for example, in the X-direction and the Y-direction in the trench GT1. The first control electrode is electrically insulated from the first semiconductor layer 11, the second semiconductor layer 13 and third semiconductor layer 15 by a first insulating film 23. The first insulating film 23 is, for example, a gate insulating film. The first insulating film 23 is, for example, a silicon oxide film.

The first control electrode 20 includes a portion that extends in the first semiconductor layer 11. The first semiconductor layer 11 faces the first control electrode 20 via the first insulating film 23. Also, the second semiconductor layer 13 faces the first control electrode 20 via the first insulating film 23. The third semiconductor layer 15 contacts the first insulating film 23.

The second control electrode 30 is, for example, a field plate and is provided in a trench GT2. The second control electrode 30 is, for example, conductive polysilicon. The trench GT2 extends, for example, in the Z-direction and has a depth from the upper surface of the fourth semiconductor layer 17 into the first semiconductor layer 11. For example, the trench GT2 also extends in the Y-direction. The second control electrode 30 extends, for example, in the X-direction and the Y-direction in the trench GT2. The second control electrode 30 is electrically insulated from the first semiconductor layer 11, second semiconductor layer 13 and fourth semiconductor layer 17 by a second insulating film 33. The second insulating film 33 is, for example, a silicon oxide film.

The second control electrode 30 includes a portion that extends in the first semiconductor layer 11. The first semiconductor layer 11 faces the second control electrode 30 via the second insulating film 33. Also, the second semiconductor layer 13 faces the second control electrode 30 via the second insulating film 33. For example, the fourth semiconductor layer 17 contacts the second insulating film 33.

The semiconductor device 1 further includes, for example, a first electrode ET1, a second electrode ET2, a third electrode CT, and a control terminal GTE.

The first electrode ET1 is electrically connected to the third semiconductor layer 15. The second electrode ET2 is electrically connected to the fourth semiconductor layer 17. The third electrode CT is electrically connected to the fifth semiconductor layer 19.

The control terminal GTE is electrically connected to the first control electrode 20. For example, the control terminal GTE is electrically connected to the first control electrode 20 via a contact hole that is provided in an insulating film 25 covering the upper end of the first control electrode 20. The insulating film 25 is, for example, a silicon oxide film.

The first control electrode 20 includes a contact portion (not illustrated) extending, for example, outside the trench GT1 at the end of the first control electrode 20 in the Y-direction; and the control terminal GTE is electrically connected to the contact portion of the first control electrode 20.

The second control electrode 30 is controlled independently of the first control electrode 20. For example, the second control electrode 30 is controlled to have the same potential as the first electrode ET1. For example, the second control electrode 30 is electrically connected to the first electrode ET1 via a contact hole (not illustrated) provided in an insulating film 35 covering the upper end of the second control electrode 30. The insulating film 35 is, for example, a silicon oxide film.

The second control electrode 30 may be controlled to have a potential that is different from the potentials of the first electrode ET1 and the first control electrode 20.

FIGS. 2A to 2D are schematic plan views showing the semiconductor device 1 according to the embodiment. FIGS. 2A to 2D are schematic views illustrating the arrangement of the third and fourth semiconductor layers 15 and 17. CH1 and CH2 are illustrated in each drawing, and represent the contact holes provided in an inter-layer insulating film (not-illustrated).

As shown in FIGS. 2A to 2D, the third semiconductor layer 15 and the fourth semiconductor layer 17 are arranged in the X-Y plane. The surface area of the fourth semiconductor layer 17 is greater than the surface area of the third semiconductor layer 15 in the X-Y plane.

The first electrode ET1 is electrically connected to the third semiconductor layer 15 via the contact hole CH1. The second electrode ET2 is electrically connected to the fourth semiconductor layer 17 via the contact hole CH2.

Figure 3:
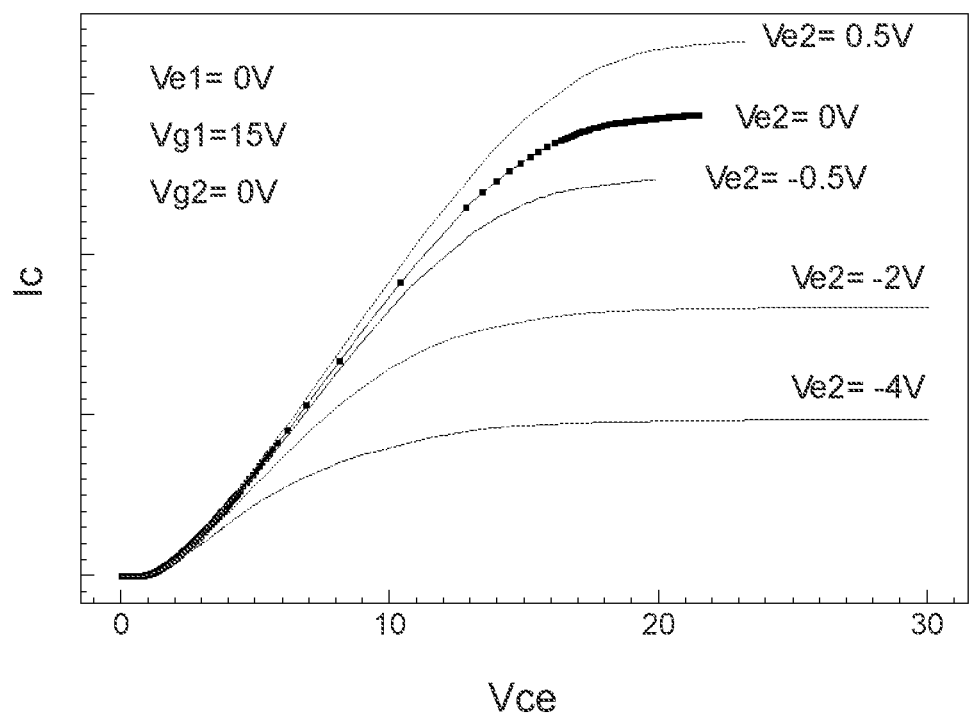
FIG. 3 is a graph showing characteristics of the semiconductor device according to the embodiment.

FIG. 3 is a graph showing characteristics of the semiconductor device 1 according to the embodiment. The horizontal axis is a collector voltage Vce applied between the first electrode ET1 and the third electrode CT. The vertical axis is a collector current Ic flowing between the first electrode ET1 and the third electrode CT.

In the example, a potential Ve1 of the first electrode ET1 is set to 0 V, a gate voltage Vg1 applied between the first control electrode 20 and the first electrode ET1 is set to 15 V, and the voltage applied between the second control electrode 30 and the first electrode ET1 is set to 0 V. In such a case, the threshold voltage of the first control electrode 20 is less than 15 V.

FIG. 3 illustrates the collector currents Ic when a potential Ve2 of the second electrode ET2 is changed with respect to the potential Ve1 of the first electrode ET1. For example, when the potential Ve2 of the second electrode ET2 is 0 V, the collector current Ic shown in FIG. 3 exhibits a normal characteristic of the IGBT which includes an emitter electrode electrically connected to both the third semiconductor layer 15 and the fourth semiconductor layer 17.

As shown in FIG. 3, for the potential Ve1 (=0 V) of the first electrode ET1, the collector current Ic decreases as the potential Ve2 of the second electrode ET2 is reduced to −0.5 V, −2 V, and −4 V. Also, the collector current Ic increases when the potential Ve2 of the second electrode ET2 is 0.5 V.

Figure 4:
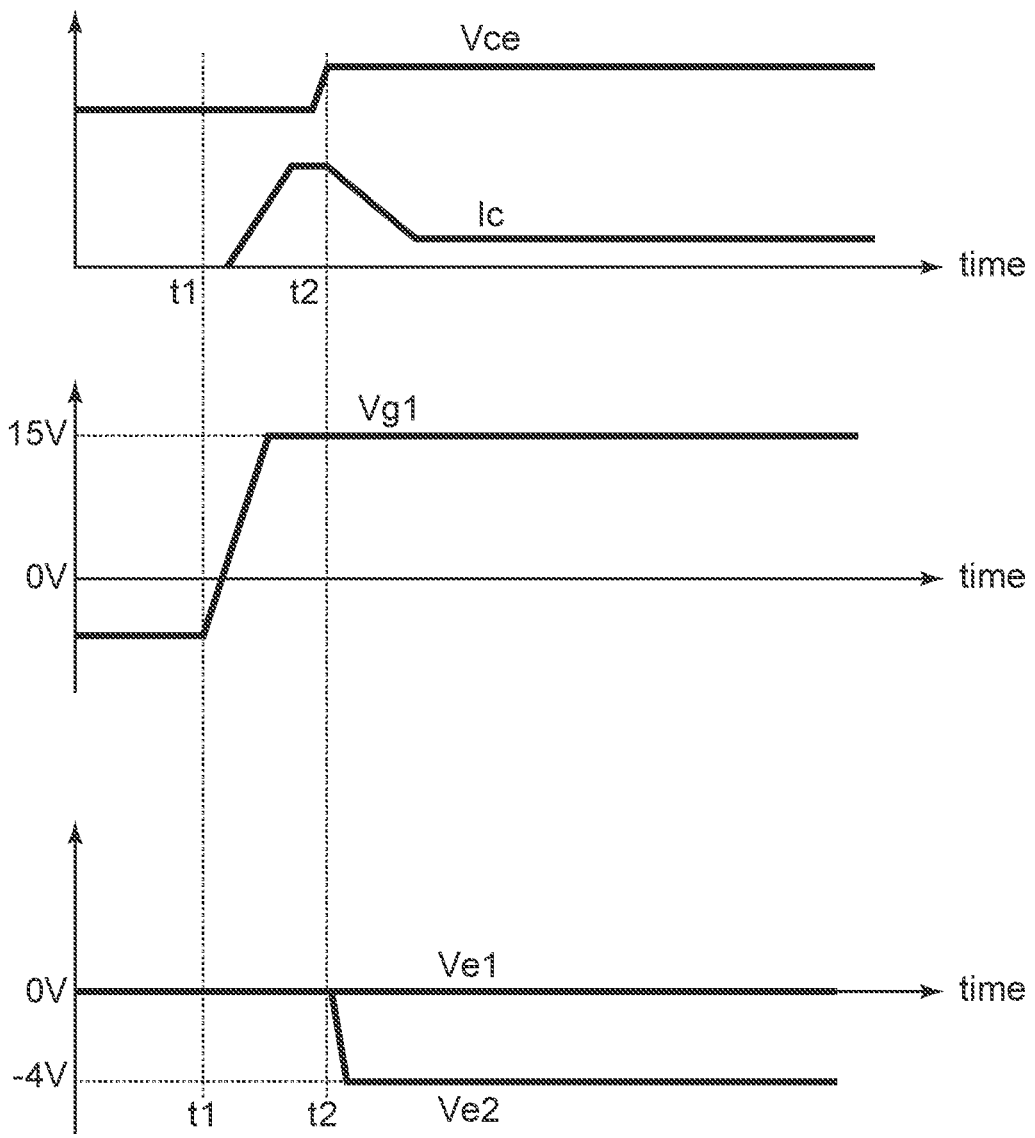
FIG. 4 is a timing chart illustrating a method for controlling the semiconductor device according to the embodiment.

FIG. 4 is a timing chart illustrating a method for controlling the semiconductor device 1 according to the embodiment. FIG. 4 illustrates the temporal change of the collector voltage Vce, the collector current Ic, the gate voltage Vg1, the potential Ve1 of the first electrode ET1, and the potential Ve2 of the second electrode ET2.

Here, the collector voltage Vce is the voltage applied between the first electrode ET1 and the third electrode CT. The collector current Ic is the current flowing between the first electrode ET1 and the third electrode CT. The gate voltage Vg1 is the voltage applied between the first electrode ET1 and the first control electrode 20.

For example, at a time t1, the gate voltage Vg1 between the first electrode ET1 and the first control electrode 20 is changed from a negative voltage to +15 V, which is greater than the threshold voltage, while a prescribed collector voltage Vce is applied between the first electrode ET1 and the third electrode CT. At this time, the potential Ve1 of the first electrode ET1 and the potential Ve2 of the second electrode ET2 both are 0 V.

A first-conductivity type inversion layer is induced by the potential of the first control electrode 20 at the interface between the first insulating film 23 and the second semiconductor layer 13; and the collector current Ic increases to the level of a prescribed on-current.

At a time t2 that is after the time t1, an increase of the collector voltage Vce is detected, for example, due to a short-circuit fault (referring to FIGS. 6A and 6B), and then, the potential Ve2 of the second electrode ET2 is reduced to a level, e.g., −4 V, that is less than the potential Ve1 of the first electrode ET1. The collector current Ic is reduced thereby (referring to FIG. 3). The short-circuit fault is detected when the collector voltage Vce exceeds, for example, a prescribed threshold.

Figure 6A:
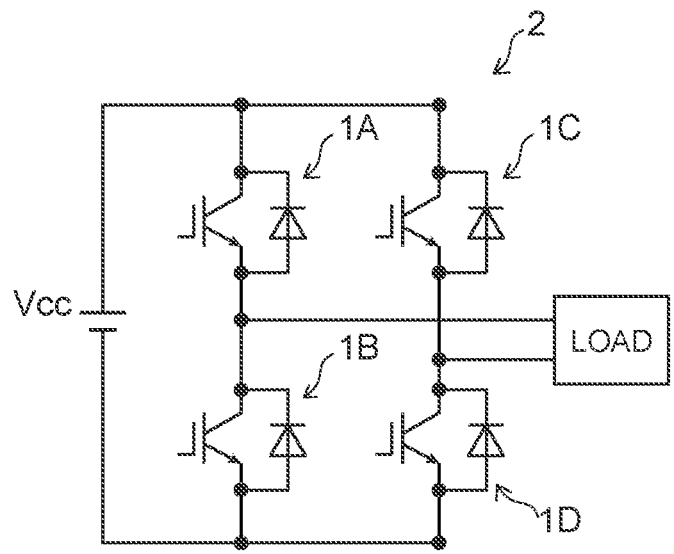
FIGS. 6A and 6B are schematic views showing a power converter 2 according to a comparative example.
Figure 6B:
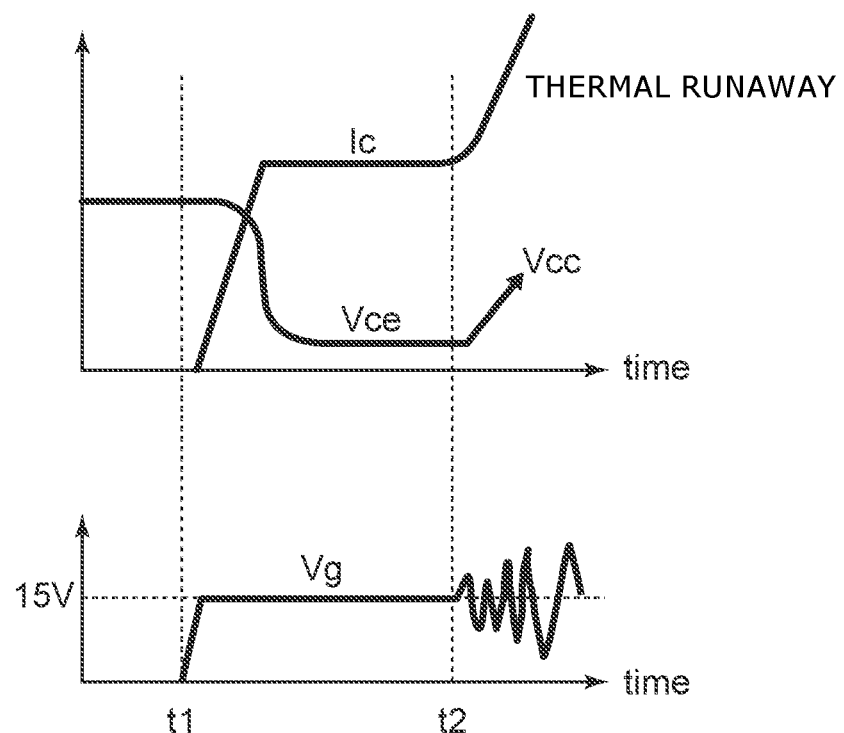

FIGS. 6A and 6B are schematic views showing a power converter 2 according to a comparative example. FIG. 6A is a circuit diagram of the power converter 2. FIG. 6B is a timing chart illustrating the operation in the fault of the power converter 2.

As shown in FIG. 6A, the power converter 2 is, for example, a single-phase inverter. The power converter 2 includes semiconductor devices 1A to 1D. The semiconductor devices 1A to 1D are, for example, normal IGBTs in which the emitter electrode is electrically connected to both the n-type emitter layer and the p-type emitter layer.

FIG. 6B illustrates the temporal change of the collector voltage Vce, the collector current Ic, and a gate voltage Vg of the semiconductor device 1B.

For example, at the time t1, the power converter 2 is controlled so that the semiconductor device 1B and the semiconductor device 1C are in the on-state, and the semiconductor device 1A and the semiconductor device 1D are in the off-state. The gate voltage Vg of the semiconductor device 1B is increased from the off-level to the on-level, e.g., 15 V. Accordingly, the collector current Ic increases to the level of the on-current; and the collector voltage decreases to the level of the on-voltage.

For example, if a short-circuit fault occurs in the semiconductor device 1A at the time t2, the collector voltage Vce increases to, for example, the level of a power supply voltage Vcc. Accordingly, the collector current Ic also increases, and a so-called thermal runaway state occurs. As a result, there are cases where breakdown of the semiconductor device 1B also occurs, and explosive destruction of the power converter 2 occurs.

Conversely, if the semiconductor device 1 according to the embodiment is used as the semiconductor devices 1A to 1D, for example, the potential Ve2 of the second electrode ET2 is reduced to a lower level than the potential Ve1 of the first electrode ET1 in the semiconductor device 1B when the short-circuit fault of the semiconductor device 1A is detected. The increase of the collector current Ic can be suppressed thereby, and the thermal runaway can be prevented.

In the example described above, the potential Ve2 of the second electrode ET2 is reduced in the on-state of the semiconductor device 1, but the embodiment is not limited thereto. For example, when the semiconductor device 1 is in the off-state, the potential Ve2 of the second electrode ET2 may be reduced by detecting an increase of the collector voltage Vce. When the semiconductor device 1 becomes in the turn-on state, the collector current Ic can be reduced thereby to avoid the thermal runaway. The detection timing for reducing the potential Ve2 of the second electrode ET2 is not limited to the increase of the collector voltage Vce; for example, the potential Ve2 of the second electrode ET2 may be reduced by detecting the change of another parameter of the power converter 2.

Figure 5:
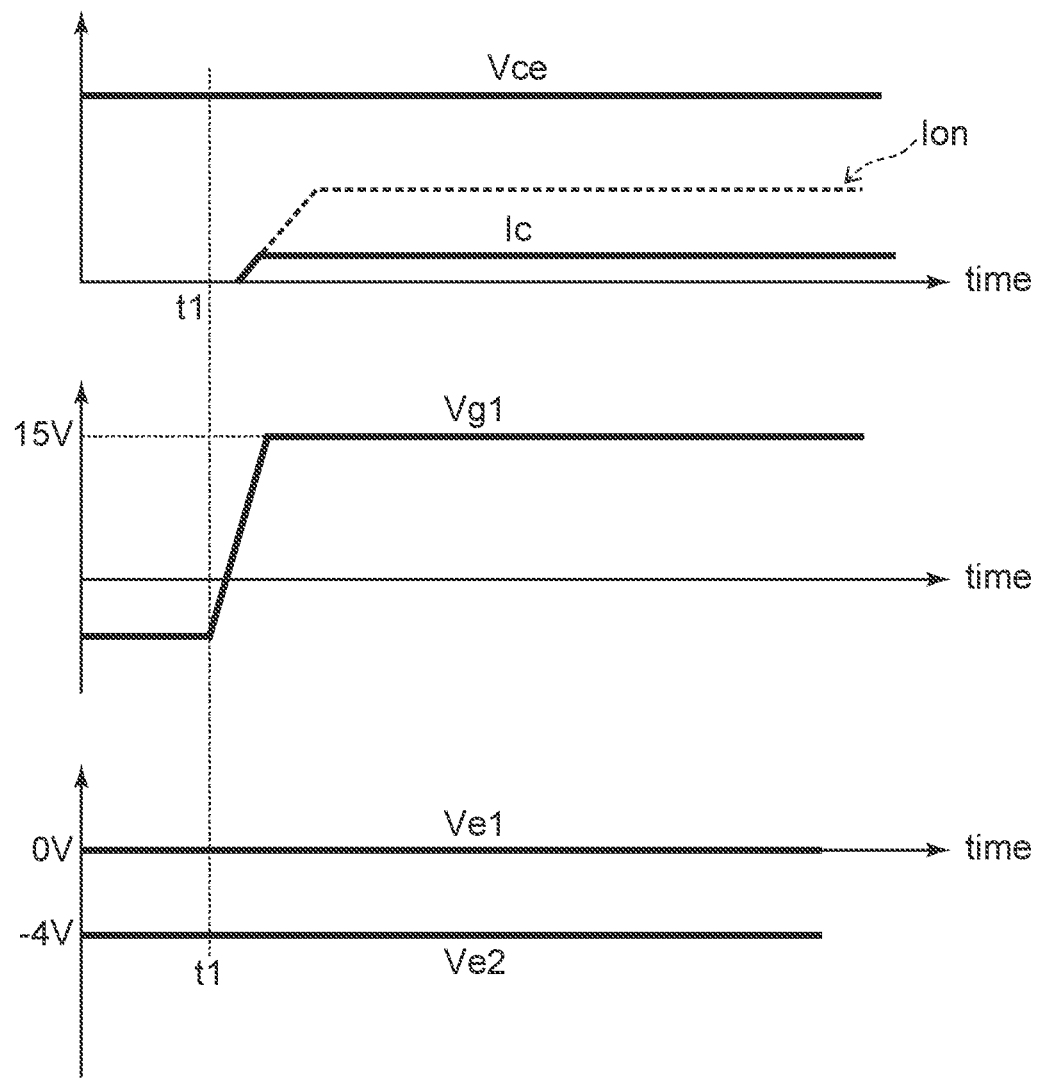
FIG. 5 is a timing chart showing a method for controlling the semiconductor device according to a modification of the embodiment.

FIG. 5 is a timing chart showing a method for controlling the semiconductor device 1 according to a modification of the embodiment. FIG. 5 illustrates the temporal change of the collector voltage Vce, the collector current Ic, the gate voltage Vg1, the potential Ve1 of the first electrode ET1, and the potential Ve2 of the second electrode ET2.

In the example, the potential Ve2 of the second electrode ET2 is constantly maintained at a level lower than the potential Ve1 of the first electrode ET1, e.g., −4 V. Thereby, the collector current Ic does not increase to the original level of the on-current even when the gate voltage Vg1 increases at the time t1 from a negative voltage to 15 V, which is greater than the threshold voltage, so that a first-conductivity type inversion layer is induced at the interface between the second semiconductor layer 13 and the first insulating film 23. In other words, the on-current can be steadily suppressed by controlling the potential Ve2 of the second electrode ET2.

According to such a control method, for example, the on-current can be suppressed to be the desired level when the original level of the on-current of the semiconductor device 1 is too high. Also, there are cases where an oscillation of the gate voltage Vg1 occurs due to the increase of the on-current (referring to FIG. 6B). Such an oscillation is not limited to the thermal runaway case, and occurs when the level of the on-current is too high in the normal operation. Therefore, the oscillation of the gate voltage Vg1 can be suppressed by using the control method shown in FIG. 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer of a first conductivity type;
   a second semiconductor layer provided on the first semiconductor layer, the second semiconductor layer being of a second conductivity type;
   a third semiconductor layer provided selectively on the second semiconductor layer, the third semiconductor layer being of the first conductivity type;
   a fourth semiconductor layer provided selectively on the second semiconductor layer, the fourth semiconductor layer being of the second conductivity type, the third and fourth semiconductor layers being arranged along the second semiconductor layer and having first and second surface areas respectively in a plane parallel to an upper surface of the second semiconductor layer, the second surface area of the fourth semiconductor layer being greater than the first surface area of the third semiconductor layer;

a fifth semiconductor layer of the second conductivity type, the first semiconductor layer being provided between the second semiconductor layer and the fifth semiconductor layer;
a first control electrode provided in a first trench, the first trench extending into the first semiconductor layer from an upper surface of the third semiconductor layer, the first control electrode being electrically insulated from the first, second, and third semiconductor layers by a first insulating film, the second semiconductor layer facing the first control electrode via the first insulating film, the third semiconductor layer contacting the first insulating film;
a first electrode electrically connected to the third semiconductor layer;
a second electrode electrically connected to the fourth semiconductor layer, the second electrode being electrically isolated from the first electrode;
a third electrode electrically connected to the fifth semiconductor layer; and
a control terminal electrically connected to the first control electrode.

2. The device according to claim 1, further comprising:
a second control electrode provided in a second trench, the second trench extending into the first semiconductor layer from an upper surface of the fourth semiconductor layer,
the second control electrode being electrically insulated from the first, second, and fourth semiconductor layers by a second insulating film,
the second semiconductor layer facing the second control electrode via the second insulating film,
the fourth semiconductor layer contacting the second insulating film.

3. The device according to claim 2, wherein
the second control electrode is at a position next to the first control electrode.

4. The device according to claim 1, wherein
the third semiconductor layer includes a first-conductivity-type impurity with a higher concentration than a concentration of a first-conductivity-type impurity in the first semiconductor layer, and
the fourth semiconductor layer includes a second-conductivity-type impurity with a higher concentration than a concentration of a second-conductivity-type impurity in the second semiconductor layer.

5. A method for controlling a semiconductor device, the device including:
a first semiconductor layer of a first conductivity type;
a second semiconductor layer provided on the first semiconductor layer, the second semiconductor layer being of a second conductivity type;
a third semiconductor layer provided selectively on the second semiconductor layer, the third semiconductor layer being of the first conductivity type;
a fourth semiconductor layer provided selectively on the second semiconductor layer, the fourth semiconductor layer being of the second conductivity type, the third and fourth semiconductor layers being arranged along the second semiconductor layer;
a fifth semiconductor layer of the second conductivity type, the first semiconductor layer being provided between the second semiconductor layer and the fifth semiconductor layer;
a first control electrode provided in a first trench, the first trench extending into the first semiconductor layer from an upper surface of the third semiconductor layer, the first control electrode being electrically insulated from the first, second, and third semiconductor layers by a first insulating film, the second semiconductor layer facing the first control electrode via the first insulating film, the third semiconductor layer contacting the first insulating film;
a first electrode electrically connected to the third semiconductor layer;
a second electrode electrically connected to the fourth semiconductor layer, the second electrode being electrically isolated from the first electrode;
a third electrode electrically connected to the fifth semiconductor layer; and
a control terminal electrically connected to the first control electrode,
the method comprising:
setting a potential connected to the fourth semiconductor layer via the second electrode to be less than a potential connected to the third semiconductor layer via the first electrode.

6. A method for controlling a semiconductor device, the device including:
a first semiconductor layer of a first conductivity type;
a second semiconductor layer provided on the first semiconductor layer, the second semiconductor layer being of a second conductivity type;
a third semiconductor layer provided selectively on the second semiconductor layer, the third semiconductor layer being of the first conductivity type;
a fourth semiconductor layer provided selectively on the second semiconductor layer, the fourth semiconductor layer being of the second conductivity type, the third and fourth semiconductor layers being arranged along the second semiconductor layer;
a fifth semiconductor layer of the second conductivity type, the first semiconductor layer being provided between the second semiconductor layer and the fifth semiconductor layer;
a first control electrode provided in a first trench extending in the first semiconductor layer from an upper surface of the third semiconductor layer, the first control electrode being electrically insulated from the first, second, and third semiconductor layers by a first insulating film, the second semiconductor layer facing the first control electrode via the first insulating film, the third semiconductor layer contacting the first insulating film;
a first electrode electrically connected to the third semiconductor layer;
a second electrode electrically connected to the fourth semiconductor layer;
a third electrode electrically connected to the fifth semiconductor layer; and
a control terminal electrically connected to the first control electrode,
the method comprising:
setting a potential connected to the fourth semiconductor layer via the second electrode to be less than a potential connected to the third semiconductor layer via the first electrode when a voltage between the first electrode and the third electrode exceeds a prescribed value.

7. The method according to claim 6, comprising:
setting the potential connected to the fourth semiconductor layer to be less than the potential connected to the third semiconductor layer via the first electrode while a voltage that is greater than a threshold voltage of the first control electrode is applied between the control terminal and the first electrode.

8. The method according to claim 6, wherein
the potential of the fourth semiconductor layer is same as the potential of the third semiconductor layer before the setting of the potential connected to the fourth semiconductor layer via the second electrode to be less than the potential connected to the third semiconductor layer via the first electrode.

9. The method according to claim 6, wherein
the device further includes a second control electrode next to the first control electrode,
the second control electrode is provided in a second trench, the second trench extending into the first semiconductor layer from an upper surface of the fourth semiconductor layer,
the second control electrode is electrically insulated from the first, second, and fourth semiconductor layers by a second insulating film,
the second semiconductor layer faces the second control electrode via the second insulating film, and
the method further comprises controlling a potential of the second control electrode to be equal to a potential of the first electrode.

10. The method according to claim 6, wherein
the device further includes a second control electrode next to the first control electrode,
the second control electrode is provided in a second trench, the second trench extending in the first semiconductor layer from an upper surface of the fourth semiconductor layer,
the second control electrode is electrically insulated from the first, second, and fourth semiconductor layers by a second insulating film,
the second semiconductor layer faces the second control electrode via the second insulating film, and
the method further comprises controlling a potential of the second control electrode to be different from a potential of the first electrode and a potential of the first control electrode.

* * * * *